United States Patent [19]

Leduc

[11] Patent Number: 5,021,787
[45] Date of Patent: Jun. 4, 1991

[54] DIGITAL-ANALOG CONVERTER FOR CONVERSION OF LAW A- ENCODED DIGITAL SIGNALS INTO ANALOG SIGNALS

[75] Inventor: Yves Leduc, Chemin Des Martels, Belgium

[73] Assignee: Texas Instruments Incorporated, Dallas, Tex.

[21] Appl. No.: 518,375

[22] Filed: May 3, 1990

Related U.S. Application Data

[63] Continuation of Ser. No. 7,839, Mar. 26, 1987, abandoned.

[51] Int. Cl.⁵ .............................................. H03M 1/80
[52] U.S. Cl. ...................................... 341/150; 241/153
[58] Field of Search ............... 341/146, 147, 150, 153, 341/154

[56] References Cited

U.S. PATENT DOCUMENTS

| | | | |
|---|---|---|---|
| 4,195,282 | 3/1980 | Cameron | 341/153 |
| 4,311,988 | 1/1982 | Kelley et al. | 341/145 |
| 4,404,544 | 9/1983 | Dwarakanath | 341/150 |
| 4,468,654 | 8/1984 | Kapral | 341/150 |
| 4,507,650 | 3/1985 | Kapral | 341/150 |
| 4,651,132 | 3/1987 | Lillis et al. | 341/156 |

*Primary Examiner*—J. R. Scott
*Assistant Examiner*—Marc S. Hoff
*Attorney, Agent, or Firm*—William E. Hiller; N. Rhys Merrett; Melvin Sharp

[57] ABSTRACT

Digital-analog converter intended to convert into analog signals digital signals formed of sign bits, of step bits and of segment bits, particularly signals coded by data compression according to law A, the said converter comprising a sign generator (4), intended to receive the sign bit of the said digital signal, a step generator (7), connected to the output of the sign generator and intended to receive the step bits of the said digital signal and to a segment generator (8) connected to the step generator and intended to receive the segment bits of the said digital signal, characterized in that the segment generator (8) is connected to the sign generator by means of the step generator (7) only.

5 Claims, 2 Drawing Sheets

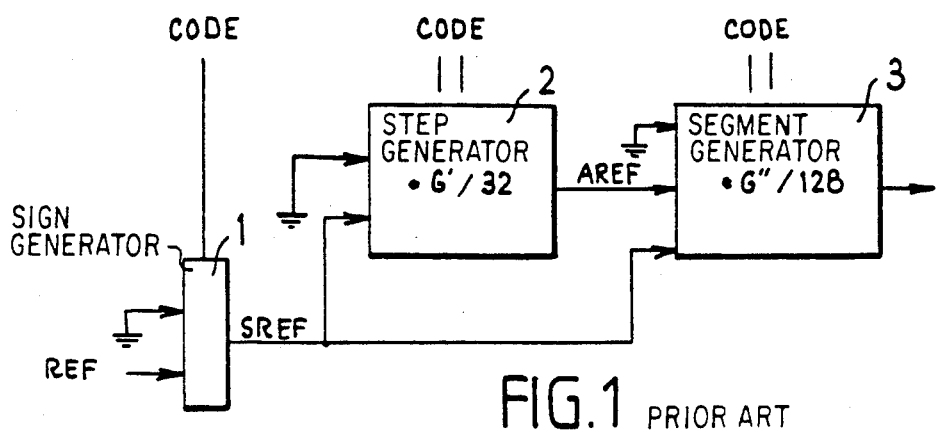
FIG.1 PRIOR ART
FIG.2
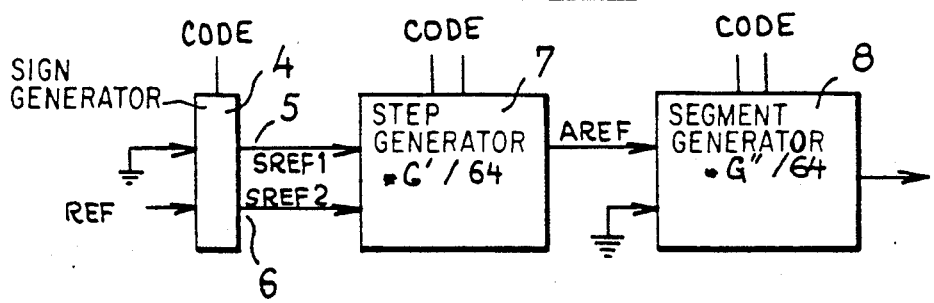
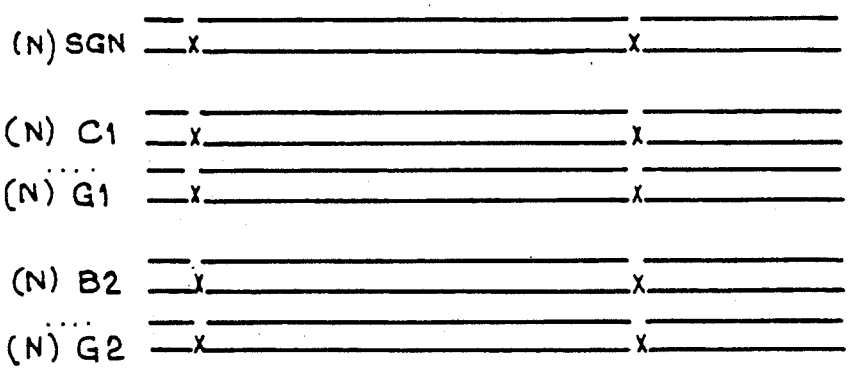
FIG.4
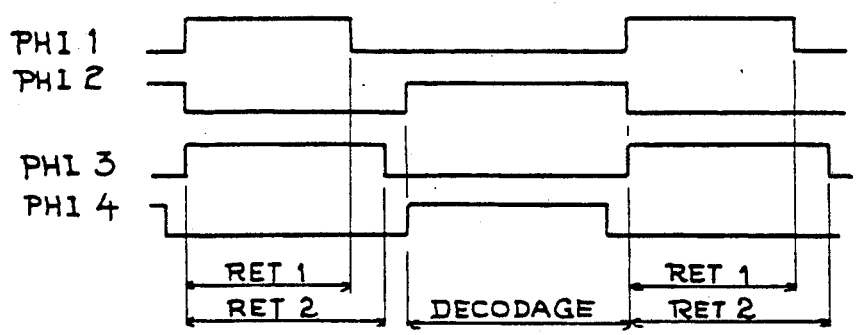

DIGITAL-ANALOG CONVERTER FOR CONVERSION OF LAW A- ENCODED DIGITAL SIGNALS INTO ANALOG SIGNALS

This is a continuation, of application Ser. No. 007,839, filed Mar. 26, 1987, now abandoned.

The present invention relates to digital-analog converters and refers more particularly to digital-analog converters of signals coded by standardized data compression according to a standard compression law called law A.

Traditional law A digital-analog converters are produced according to the following algorithm:

Segment 0

Output $=(+/-) \cdot (G'/32 + 0) \cdot (1)/128 \cdot VREF$

Segment 1 to 7

Output $=(+/-) \cdot (G'/32+1) \cdot (G'')/128 \cdot VREF$

G' and G" being the gains of two successive decoding stages respectively,
where :
$G' = (1, 3, 5, 7, \ldots 29$ or $31)$
$G'' = (1, 2, 4, 8, \ldots 32$ or $64)$ This algorithm is materialized by a three-stage processor operated by means of silicon circuits.

It comprises a sign generator, a step generator and a segment generator.

The segment generator receives the reference voltage allocated with a sign "SREF" and a processed signal "AREF" which is the signal from the step generator.

An error at the output of the step generator directly causes a distortion at the output of the segment generator.

Decoders of the type mentioned above are strongly dependent on the performance of the sign generator and that of the step generator (offset, limited amplifier gain, amplifier voltage offset, clock injection. . . ).

The invention aims to create a new digital-analog converter which is not affected by these problems and has other advantages over traditional digital-analog converters.

It also aims to produce a digital-analog converter which is designed to be associated with a speech synthesis device which is of simple construction, which has a reduced number of components, which is small in size and whose performance is improved.

Its object is therefore a digital-analog converter intended to convert into analog signals digital signals formed of sign bits, of step bits and of segment bits, particularly signals coded by data compression according to law A, the said converter comprising a sign generator, intended to receive the sign bit of the said digital signal, a step generator, connected to the output of the sign generator and intended to receive the step bits of the said digital signal and a segment generator connected to the step generator and intended to receive the segment bits of the said digital signal, characterized in that the segment generator is connected to the sign generator by means of the step generator only.

The invention will be better understood with the help of the following description, given solely by way of example and with reference to the appended drawings in which:

FIG. 1 is a block diagram of a traditional digitalanalog converter;

FIG. 2 is a block diagram of a digital-analog converter according to the invention;

FIG. 4 is a diagram showing the appearance of the clock and input signals of the circuit in FIG. 3.

Figure 3:
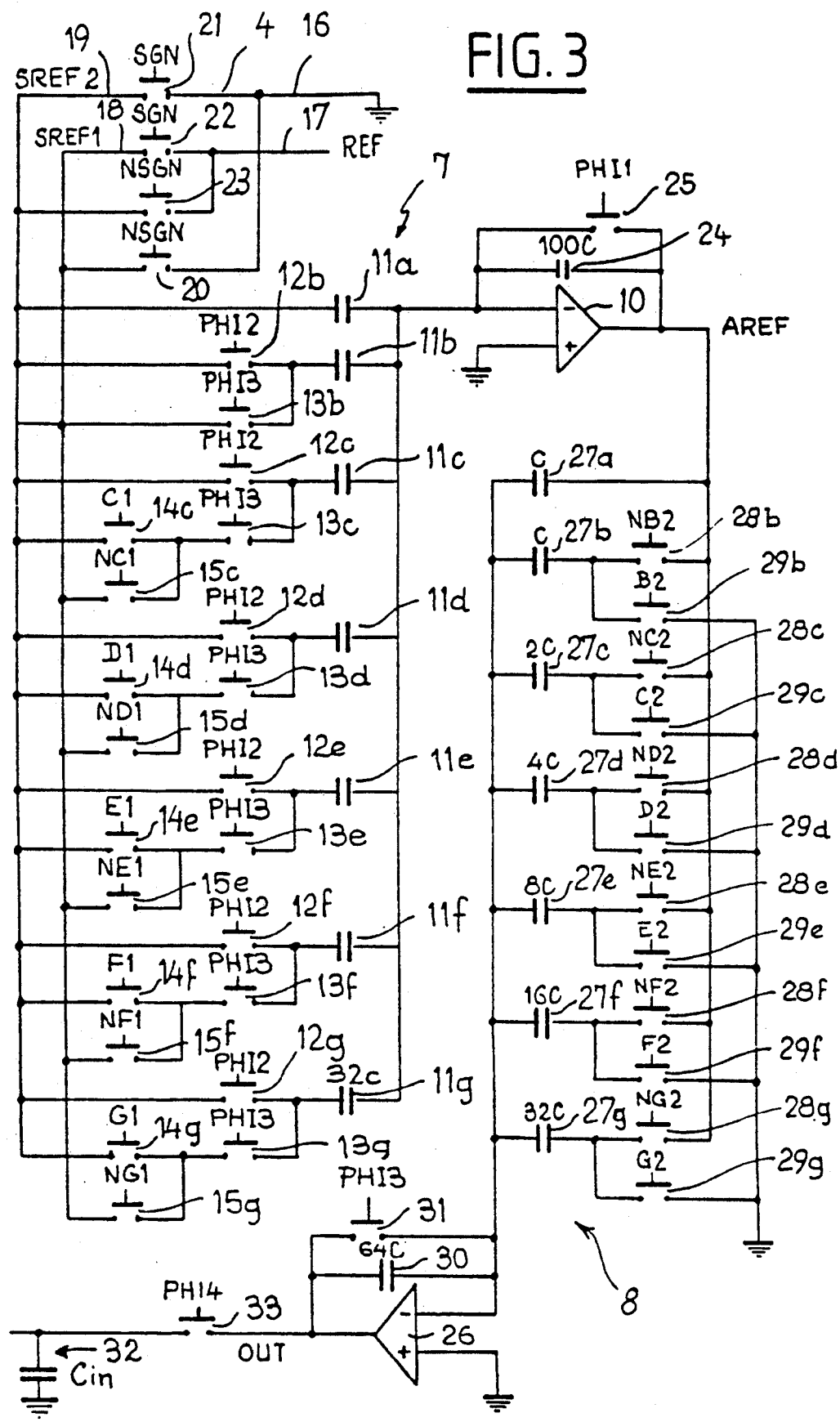
FIG. 3 is a complete circuit diagram of the digitalanalog decoder according to the invention.

As already mentioned, a traditional digital-analog converter of the type shown in FIG. 1 comprises a sign generator 1, which receives on it sinput a sign reference signal and which is connected at its output to the input of a step generator 2 as well as to an input of a segment generator 3 another input of which is connected to the output of the step generator 2.

It can be seen that an error at the output of the step generator 2 directly causes a distortion at the output of the segment generator 3.

In accordance with the present invention, another way of decoding law A, has been provided which depends upon the following algorithm:

OUTPUT $=(+/-) \cdot G' \cdot (1/64) \cdot G'' \cdot (1/64) \cdot VREF$
where :
$G' = (1, 3, 5, 7 \ldots 61$ or $63)$
$G'' = (1, 2, 4, 8 \ldots 32$ or $64)$ This algorithm is translated into a circuit based on silicon components, having three stages, shown in FIG. 2.

This circuit comprises a sign generator 4 having one input intended to receive a reference signal and two outputs 5,6 on which appear two signals $SREF_1$ and $SREF_2$.

The two outputs 5, 6 of the sign generator are applied to two corresponding inputs of a step generator 7 whose output is connected to an input of a segment generator 8.

In FIG. 3, the step generator and the segment generator of the circuit in FIG. 2 have been shown in detail.

The step generator 7 is essentially formed by an operational amplifier 10 whose positive input is earthed and whose negative input is connected to seven capacitors 11a to 11g whose terminals opposite the input of the amplifier 10 are connected to one of the outputs of the sign generator 4, either directly for capacitor 11a, or via one or more switches 12b to 12g, 13b to 13g, 14c to 14g and 15c to 15g depending on the capacitor concerned.

The values of the capacitors 11a to 11g are 7C, 2C, 4C, 8C, 16C and 32C respectively. The value of capacitor 24 can be adjusted in order to regulate the gain of the complete converter. In this example, this value is 100 C.

The sign generator 4 is formed by a simple switching circuit with one input 16 earthed and one input 17 at a reference voltage and two sign outputs 18, 19. Two switches 20 and 21 are connected between earth and outputs 18 and 19 respectively. Two other switches 22 and 23 are connected between the reference input 17 and outputs 18 and 19 respectively.

A capacitor 24 and a switch 25 are connected in parallel between the negative input and the output of the operational amplifier 10.

The segment generator 8 is formed by an operational amplifier 26 whose positive input is earthed and whose negative input is connected to the output of the amplifier 10 of the step generator via capacitors 27a to 27g.

Capacitor 27a is directly connected to the output of the amplifier 10, while the other capacitors are connected to the output of this amplifier via switches 28b to 28g respectively and are earthed via switches 29b to 29g respectively.

The negative input of amplifier 26 is connected to its output by means of a capacitor 30 and a switch 31 in parallel.

The values of capacitors 27a to 27g connecting the negative input of the second amplifier 26 to the output of the first amplifier 10 are C,C, 2C,4C, 8C,16C and 32C respectively and the value of capacitor 30 connecting the negative input of the second amplifier 26 to its output is 64C.

The output of amplifier 26 is connected to an output filter 32 by means of a switch 33. The input capacity of the filter serves as a sampler-blocker. This capacity is represented by capacitor Cin.

The operation of the circuit in FIG. 3 will now be descreased with reference to the diagram in FIG. 4.

The law A input code is applied at the start of the restoration phases of the step and segment generators 7 and 8 by operating those of the switches 12b to 15g of the step generator and of switches 28b to 29g of the segment generator which correspond to the code to be converted. This code remains stable throughout the cycle in accordance with the input code. The capacitors 11a to 11g and 21a to 27g of the first and second networks of switched capacitors of the step and segment generators 7 and 8 are charged according to the code applied to them by the previously mentioned switches.

The switches 12b to 15g, 25, 28b to 29g, 31 and 33 are formed by transistors connected to a logic formed from AND, NOR, OR and NAND gates (not shown) which receives the code to be converted and which selects the elements of the said code for the purpose of controlling the charging of the corresponding capacitors.

The input code to be processed is an eight-bit word (sign +7 bits).

For the purpose of simplification, the coding of step or of a segment is here considered to be a simple binary coding in four bits for the steps and 3 bits for the segments.

For example, step 10 is simply coded 1010 and segment 3 is simply coded 011.

Input code = (SIGN,SEGMENT, STEP)
SIGN : Coded by one bit, SGN
SEGMENT : Coded by 3 bits, CH2, CH1 and CH0
STEP : Coded by 4 bits, ST3, ST2, ST1, and ST0

| (OR CH2,CH1,CH0) | ST3 | ST2 | ST1 | ST0 | G' |
|---|---|---|---|---|---|
| | 0 | 0 | 0 | 0 | 1 |
| | 0 | 0 | 0 | 1 | 3 |
| | 0 | 0 | 1 | 0 | 5 |
| | 0 | 0 | 1 | 1 | 7 |
| | 0 | 1 | 0 | 0 | 9 |
| | 0 | 1 | 0 | 1 | 11 |
| | 0 | 1 | 1 | 0 | 13 |
| | 0 | 1 | 1 | 1 | 15 |
| | 1 | 0 | 0 | 0 | 17 |
| | 1 | 1 | 1 | 1 | 63 |
| CH2 | CH1 | CH0 | G'' | | |
| 0 | 0 | 0 | 1 | | |
| 0 | 0 | 1 | 1 | | |
| 0 | 1 | 0 | 2 | | |
| 0 | 1 | 1 | 4 | | |
| 1 | 0 | 0 | 8 | | |
| 1 | 0 | 1 | 16 | | |
| 1 | 1 | 0 | 32 | | |
| 1 | 1 | 1 | 64 | | |

In this simplified diagram, neither the sign processor, nor the switches decoding the input sign are shown.

During the restoration phases $RET_1$ and $RET_2$, the integration capacitors are short-circuited.

The selected input capaciters of the step generator 7 are connected to the reference voltage an are thus pre-charged to a voltage equal to that of the reference voltage reduced by the offset voltage of the first amplifier 10. The non-selected capacitors are earthed and are thus pre-charged to a voltage equal to the offset voltage of the first amplifier 10.

The selected input capacitors of the segment generator 8 are connected to the output of the step generator 7 and store the combined offset of the two amplifiers 10 and 20.

The non-selected capacitors are earthed and are thus pre-charged to a voltage equal to the offset voltage of the second amplifier 20.

The RET1 phase is ended when switch 25 short-circuiting the integration capacitor 24 connected in parallel with the switch 25 between the negative input and the output of the first amplifier 10 of the step generator 7 is open. The switching noises due to the clock signals are then stored in the selected input capacitors 27a to 27g of the segment generator 8.

The RET2 phase is ended when the switch 31 short-circuiting the integration capacitor 30 of the segment generator 8 is open. The switching noise due to the clock signals introduces a constant offset at the output of the segment generator 8.

During the decoding phase, the input capacitors of the step generator are earthed, the selected capacitors 11a to 11g of this generator transfer theri charge to the integration capacitor 24 and the non-selected capacitors remain grounded and, for this reason, do not transfer any charge.

The selected capacitors of the segment generator remain connected to the output of the step generator.

These capacitors controlled by this output transfer their charge to the integration capacitor 30 of the segment generator 8. The non-selected capacitors remain grounded and, for this reason, do not transfer any charge.

The offset of the first amplifier and the switching noise due to the clock signals during the opening of the switch 25 short-circuiting the integration capacitor 24 of the step generator 7 have no effect on the output of the system. A limited gain of the first amplifier would not cause any distortion at the output but would slightly reduce the overall gain.

The offset of the second amplifier 26 and the switching noise due to the clock signals on the opening of switch 31 short-circuiting the integration capacitor 30 of the segment generator 8 introduce a constant systematic offset at the output of the system with no distortion. A limited gain of the second amplifier 26 would not cause any distortion at the output but would slightly reduce the gain of the system.

The suppression of interferences enables a considerable simplification of the sign generator of such a system.

The consequences of a clock injection are also greatly reduced by the fact that all the switches operate at a practically constant voltage. For the same reasons, the consequences of non-linear behavior of the component devices (switches, stray capacity of distributed lines. . . ) are also considerably reduced.

One advantage of the invention is that no following amplifier is used, as a device of this type has a reduced input dynamic range which limits the dynamic range of the system.

An example of conversion of a law A code using the circuit in FIG. 3 is given hereafter.

The control signals SGN, ... $G_1$, B2, ... G2 are the results of decoding the eight-bit "law A" input code (sign, CH2, CH1, CH0, ST3, ST2, ST1, ST0).

In FIG. 3, the signals applied to the various switches of the circuit have the following meanings.

| | |
|---|---|
| SIGN | → SGN |
| NOT (ST0) | → C1 |
| NOT (ST1) | → D1 |
| NOT (ST2) | → E1 |
| NOT (ST3) | → F1 |
| NOR(CH0,CH1,CH2) | → G1 |
| NOR (CH1, CH2) | → B2 |
| NOR(CH2, AND (CH0,CH1) | → C2 |
| NOT (CH2) | → D2 |
| NOR(AND(CH1,CH2), AND (CH0,CH1) | → E2 |
| NAND(CH1,CH2) | → F2 |
| NAND(CH0,CH1,CH2) | → G2 |

NSGN, NG, ..., NG1, NG2 are the inverses of the signals SGN, C1, ..., B2 ... G2 respectively.

In this example, use is made of the considerable advantage offered by the structure according to the invention which enables the output voltage to be adjusted independently of the value of the reference input voltage without having to use an attenuation or special amplification stage.

In the present example, a capacitor is used which is formed by 100 unit capacitors in order to attenuate the output voltage (gain 0.80).

This can be achieved with the device of the invention and cannot be achieved with the equipment of the prior technique without an additional attenuator stage.

The output of this digital-analog converter can be used directly for example in a switched capacities output filter not described here.

The "PH14" phase is used to transfer the output voltage of the converter to this filter.

An analog-digital conversion is achieved using the data of the following table.

The output of this table must be divided by 4096 and multiplied by the value of the reference voltage.

| Law A - Digital-analog conversion | | | | | | | |
|---|---|---|---|---|---|---|---|
| | | | | Segment | | | |
| Step | (0) | (1) | 2 | 3 | 4 | 5 | 6 | 7 |
| 0 | 1 | 33 | 66 | 132 | 264 | 528 | 1056 | 2112 |
| 1 | 3 | 35 | 70 | 140 | 280 | 560 | 1120 | 2240 |
| 2 | 5 | 37 | 74 | 148 | 296 | 592 | 1184 | 2368 |
| 3 | 7 | 39 | 78 | 156 | 312 | 624 | 1248 | 2496 |
| 4 | 9 | 41 | 82 | 164 | 328 | 656 | 1312 | 2624 |
| 5 | 11 | 43 | 86 | 172 | 344 | 388 | 1376 | 2752 |
| 6 | 13 | 45 | 90 | 180 | 360 | 720 | 1440 | 2880 |
| 7 | 15 | 47 | 94 | 188 | 376 | 752 | 1504 | 3008 |
| 8 | 17 | 49 | 98 | 196 | 392 | 784 | 1568 | 3136 |
| 9 | 19 | 51 | 102 | 204 | 408 | 816 | 1632 | 3264 |
| 10 | 21 | 53 | 106 | 212 | 424 | 848 | 1696 | 3392 |
| 11 | 23 | 55 | 110 | 220 | 440 | 880 | 1760 | 3520 |
| 12 | 25 | 57 | 114 | 228 | 456 | 912 | 1824 | 3648 |
| 13 | 27 | 59 | 118 | 236 | 472 | 944 | 1888 | 3776 |
| 14 | 29 | 61 | 122 | 244 | 488 | 976 | 1952 | 3904 |
| 15 | 31 | 63 | 126 | 252 | 504 | 1008 | 2016 | 4032 |

For example, if it is desired to decode the value corresponding to segment 3 and step 10, the value 212 must be delivered.

The corresponding analog voltage obtained by the circuit is therefore: 212/4096. VREF
where VREF is the reference voltage.

The device of the invention can also be applied to analog-digital conversion.

For this conversion, law A is slightly different.

The output of the following table must be divided by 4096 and multiplied by the value of the reference voltage.

| Law A - Analog Conversion (sic) | | | | | | | |
|---|---|---|---|---|---|---|---|
| | | | | Segment | | | |
| Step | (0) | (1) | 2 | 3 | 4 | 5 | 6 | 7 |
| 0 | 0 | 32 | 64 | 128 | 256 | 512 | 1024 | 2048 |
| 1 | 2 | 34 | 68 | 136 | 272 | 544 | 1088 | 2176 |
| 2 | 4 | 36 | 72 | 144 | 288 | 576 | 1152 | 2304 |
| 3 | 6 | 38 | 76 | 152 | 304 | 608 | 1216 | 2432 |
| 4 | 8 | 40 | 80 | 160 | 320 | 640 | 1280 | 2560 |
| 5 | 10 | 42 | 84 | 168 | 336 | 672 | 1344 | 2688 |
| 6 | 12 | 44 | 88 | 176 | 352 | 704 | 1408 | 2816 |
| 7 | 14 | 46 | 92 | 184 | 368 | 736 | 1472 | 2944 |
| 8 | 16 | 48 | 96 | 192 | 384 | 768 | 1536 | 3072 |
| 9 | 18 | 50 | 100 | 200 | 400 | 800 | 1600 | 3200 |
| 10 | 20 | 52 | 104 | 208 | 416 | 832 | 1664 | 3328 |
| 11 | 22 | 54 | 108 | 216 | 432 | 864 | 1728 | 3456 |
| 12 | 24 | 56 | 112 | 224 | 448 | 896 | 1792 | 3584 |
| 13 | 26 | 58 | 116 | 232 | 464 | 928 | 1856 | 3712 |
| 14 | 28 | 60 | 120 | 240 | 480 | 960 | 1920 | 3840 |
| 15 | 30 | 62 | 124 | 248 | 496 | 992 | 1984 | 3968 |

According to a known technique, an analog-digital converter can be produced using a digital-analog converter, a comparator and a logic control circuit.

This converter must follow law A for the analog-digital conversion.

All of the coefficients G' and G" can be directly adapted to this law by considering that the value to be st up are also the product of two integers.

The converters shown in FIG. 3 is of reduced size as it requires: (in the case of a system gain equal to 1)
- 64 unit capacitors as input capacitors for the step generator;
- 64 unit capacitors as integration capacitors of the step generator;
- 64 unit capacitors as input capacitors of the segment generator;
- 64 unit capacitors as integration capacitors of the segment generator; instead of:
- 32 unit capacitors as input capacitors of the step generator;
- 32 unit capacitors as integration capacitors of the step generator;
- 128 unit capacitors as input capacitors of the segment generator;
- 128 unit capacitors as integration capacitors of the segment generator;

for a traditional architecture.

This reduced size of the capacitor network enables better speed performance and/or a reduced size of the amplifiers.

Another advantage of the arrangement of the invention is that the gain of the complete system can be adjusted during the design simply by regulating the value of the first or second integration capacitors or both of them.

The reference voltage of a circuit can thus be used without adjustment by a special stage.

In addition, the decoding of the input code is particularly simple and direct.

In comparison with the traditional arrangements, the number of switches is divided by two and the control logic is considerably simplified and reduced.

I claim:

1. A digital-analog converter for converting digital signals formed of sign bits, of step bits, and of segment bits into analog signals, wherein the digital signals have been encoded by data compression in accordance with Law A, said converter comprising:

sign generator means for receiving the sign bit of the digital signal to be converted, said sign generator means including a reference voltage source and a ground source and having first and second outputs for providing first and second reference signals as selectively derived from said reference voltage source and said ground source in dependence upon the sign bit of said digital signal as received thereby;

step generator means for receiving the step bits of aid digital signal and being coupled to the output of said sign generator means for receiving said first and second reference signals as inputs and providing a step reference signal as a processed reference signal output in dependence upon said step bits of said digital signal as received thereby in conjunction with said first and second outputs from said sign generator means; and segment generator means for receiving the segment bits of said digital signal, said segment generator means being coupled to the output of the said step generator means for receiving the processed reference signal as output therefrom and being operably connected to said sign generator means only via said step generator means, said segment generator means having an output on which ana analog signal as converted from said digital signal is provided, the output voltage provided as an analog signal at the output of said segment generator means being related to the reference voltage as provided by said reference voltage source of said sign generator means in accordance with the expression:

OUTPUT=(+/−).G'.(1/64).G".(1/64).VREF,
wherein
G'=(1,3,5,7... 671 or 63); and
G"=(1,2,4,8... 32or 64) are the gains of the step generator means and of the segment generator means, respectively.

2. A digital-analog converter as set forth in claim 1, wherein said step generator means comprises a capacitor network including a plurality of capacitors of values corresponding to the analog signals to be generated in dependence upon the encoded digital signal to be converted, a plurality of switches operably associated with said plurality of capacitors defining said capacitor network and selectively operable in accordance with the encoded digital signals to be converted for selecting capacitors of said capacitor network to be connected to the first and second outputs of said sign generator means, an amplifier connected to said plurality of capacitors included in said capacitor network, and a control switch coupled to said amplifier and actuated in response to a phase control signal for regulating said amplifier improvising the processed reference signal as an output from said step generator means.

3. A digital-analog converter as set forth in claim 2, wherein said plurality of capacitors included in said capacitor network of said step generator means have capacitance values equal to C, C, 2C, 4C, 8C, 16C, 32C respectively.

4. A digital-analog converter as set forth in claim 2, wherein said segment generator means comprises a second capacitor network including a second plurality of capacitors connected to the output of said step generator means, a second plurality of witches operably associated with said second capacitor network and actuable for selecting certain ones of said second plurality of capacitors according to the analog voltages to be generated in dependence upon the encoded segment bits of said digital signal to be converted as applied to said second plurality of switches, a second amplifier connected to said second plurality of capacitors included in said second capacitor network, and a second control switch coupled to said second amplifier and actuated in response to a phase control signal in regulating the output of said second amplifier of said segment generator means for providing the converted analog signal.

5. A digital-analog converter as set forth in claim 4, wherein said second plurality of capacitors included in said second capacitor network of said segment generator means have capacitance values equal to C, C, 2C, 4C, 8C, 16C and 32C respectively.

* * * * *